US011025029B2

(12) United States Patent
Li et al.

(10) Patent No.: US 11,025,029 B2
(45) Date of Patent: Jun. 1, 2021

(54) MONOLITHIC III-V NANOLASER ON SILICON WITH BLANKET GROWTH

(71) Applicant: INTERNATIONAL BUSINESS MACHINES CORPORATION, Armonk, NY (US)

(72) Inventors: Ning Li, White Plains, NY (US); Devendra K. Sadana, Pleasantville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 437 days.

(21) Appl. No.: 14/795,405

(22) Filed: Jul. 9, 2015

(65) Prior Publication Data

US 2017/0012405 A1    Jan. 12, 2017

(51) Int. Cl.
| | |
|---|---|
| *H01S 5/02* | (2006.01) |
| *H01S 5/323* | (2006.01) |
| *H01S 5/10* | (2021.01) |
| *H01L 21/66* | (2006.01) |
| *H01S 5/343* | (2006.01) |
| *H01S 5/00* | (2006.01) |
| *H01S 5/042* | (2006.01) |

(52) U.S. Cl.
CPC ............ *H01S 5/0218* (2013.01); *H01L 22/12* (2013.01); *H01S 5/021* (2013.01); *H01S 5/1039* (2013.01); *H01S 5/1042* (2013.01); *H01S 5/323* (2013.01); *H01S 5/0014* (2013.01); *H01S 5/04257* (2019.08); *H01S 5/34306* (2013.01); *H01S 5/34313* (2013.01); *H01S 2301/173* (2013.01)

(58) Field of Classification Search
CPC .............................. H01S 5/021; H01S 5/0218
See application file for complete search history.

(56) References Cited

U.S. PATENT DOCUMENTS

| | | | |
|---|---|---|---|
| 8,421,055 B2 | 4/2013 | Kunert et al. | |
| 8,603,898 B2 | 12/2013 | Bao et al. | |
| 8,981,534 B2 | 3/2015 | Li et al. | |
| 2001/0002048 A1* | 5/2001 | Koike | B82Y 20/00 257/80 |
| 2001/0048114 A1* | 12/2001 | Morita | H01S 5/3202 257/103 |
| 2001/0050376 A1* | 12/2001 | Shibata | H01L 31/03042 257/190 |
| 2004/0206975 A1* | 10/2004 | Tojo | B82Y 20/00 257/103 |
| 2007/0181977 A1 | 8/2007 | Lochtefeld et al. | |
| 2008/0251801 A1 | 10/2008 | Ueno et al. | |
| 2010/0025657 A1* | 2/2010 | Nagahama | B82Y 20/00 257/13 |

(Continued)

FOREIGN PATENT DOCUMENTS

| | | | |
|---|---|---|---|
| JP | 2011-223017 | * | 11/2011 |
| KR | 1020080032234 A | | 4/2008 |
| TW | 201513175 A | | 4/2015 |

*Primary Examiner* — Tod T Van Roy
(74) *Attorney, Agent, or Firm* — Tutunjian & Bitetto, P.C.; Erik Johnson

(57) ABSTRACT

A nanolaser includes a silicon substrate and a III-V layer formed on the silicon substrate having a defect density due to differences in materials. A laser region is formed on or in the III-V layer, the laser region having a size based upon the defect density.

20 Claims, 3 Drawing Sheets

(56) References Cited

U.S. PATENT DOCUMENTS

| | | | |
|---|---|---|---|
| 2010/0091811 A1* | 4/2010 | Behfar | G11B 7/127 |
| | | | 372/50.23 |
| 2010/0317136 A1* | 12/2010 | Yanashima | B82Y 20/00 |
| | | | 438/46 |
| 2011/0013659 A1* | 1/2011 | Takeuchi | B82Y 20/00 |
| | | | 372/45.01 |
| 2014/0077224 A1 | 3/2014 | Li et al. | |
| 2014/0176958 A1 | 6/2014 | Flanders et al. | |
| 2015/0069517 A1 | 3/2015 | Yang et al. | |
| 2015/0115277 A1 | 4/2015 | Motsnyi et al. | |

\* cited by examiner

MONOLITHIC III-V NANOLASER ON SILICON WITH BLANKET GROWTH

BACKGROUND

Technical Field

The present invention relates to nanolasers, and more particularly to a monolithic nanolaser that employs III-V materials and is integrated with a silicon substrate.

Description of the Related Art

Many high frequency and high performance devices are employed using III-V materials, such as GaAs. However, forming substrates from these materials tends to be more expensive than employing Si wafers and Si processing techniques. The cost of substrates becomes a bottleneck to the wide scale adoption of the substrate material for these high performance discrete devices. In addition, conventional substrates, such as sapphire and silicon carbide are expensive and have limited availability in larger diameters (i.e., these are typically limited to 4-inch substrates).

Silicon remains more moderate in cost and can provide larger diameter substrates; however, issues remain for employing Si. For example, large lattice and thermal expansion mismatches exist between Si and laser materials (e.g., GaAs) and anti-phase domains exist. A more significant challenge for III-V materials for a laser on Si includes defect growth and defect reactions during lasing.

SUMMARY

A nanolaser includes a silicon substrate and a III-V layer formed on the silicon substrate having a defect density due to differences in materials. A laser region is formed on or in the III-V layer, the laser region having a size based upon the defect density.

Another nanolaser includes a silicon substrate and a buffer layer including GaAs formed on the silicon substrate and having a defect density due to differences in materials. One or more III-V layers are formed on the buffer layer and are configured to support a laser region formed on or in the one or more III-V layers. The laser region includes a multiple quantum well structure and has a size based upon the defect density.

A method for fabricating a nanolaser includes forming a III-V material directly on a silicon substrate; estimating a defect density due to differences in materials between the III-V material and the silicon substrate; and sizing a laser region to be formed on or in the III-V material wherein a size of the laser region is based upon the defect density.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
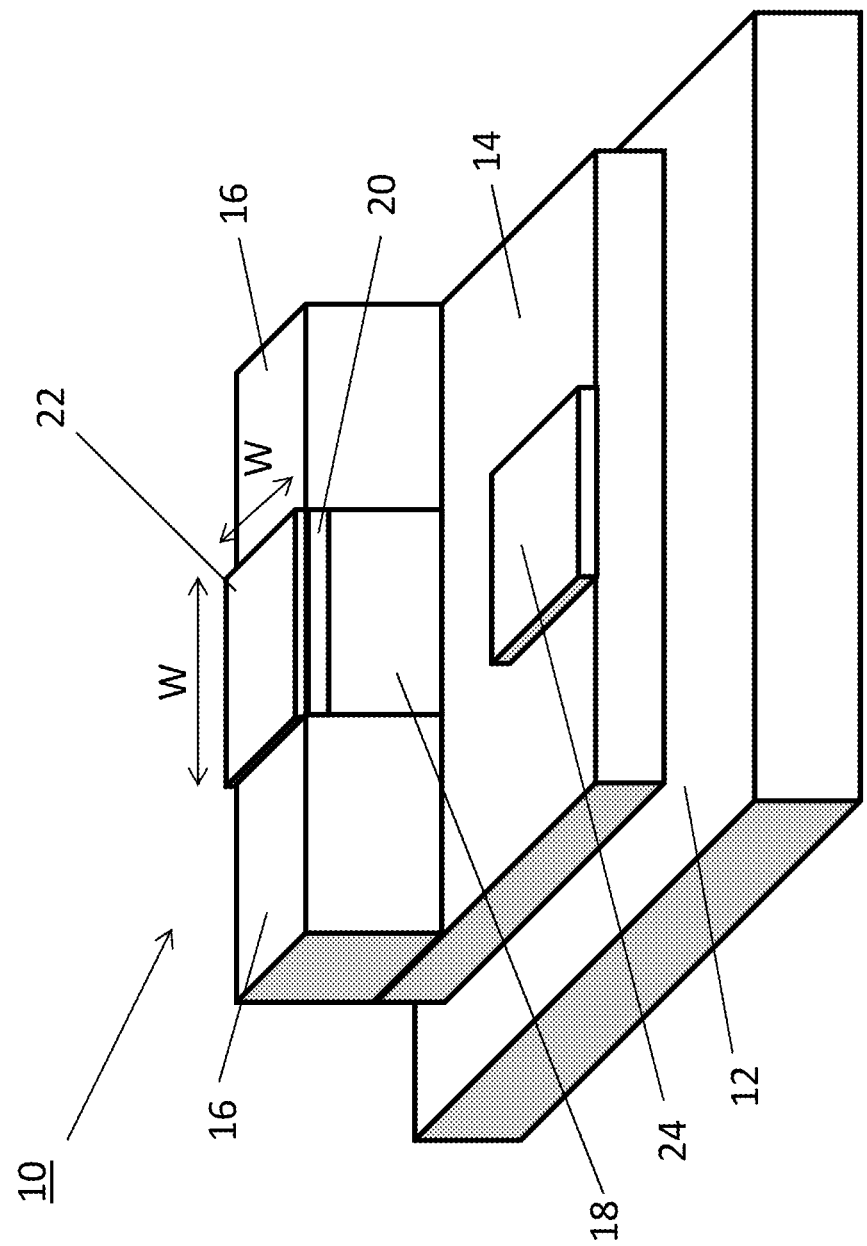
FIG. 1 is a perspective view of one illustrative nanolaser device formed from III-V materials on a silicon material of a substrate in accordance with the present principles.

In accordance with the present principles, a nanolaser device is provided in accordance with the present principles. The laser is fabricated from III-V materials to gain the performance benefits of these materials, while being formed on a monocrystalline silicon substrate to gain the processing benefits of silicon materials. One difficulty with this combination of materials is that defects occur as a result of lattice mismatches, among other things.

In one embodiment, a laser size is selected in accordance with defect density of a material based on lattice mismatch densities. In one embodiment, a laser (nanolaser) size is selected to be less than the average defect density to ensure that the laser is substantially defect free. By eliminating or significantly reducing the existence of defects in the laser device, defect-related issues that reduce performance can be reduced, such as the elimination of defect growth and defect reactions.

In one illustrative embodiment, the nanolaser employs III-V material(s) such as e.g., GaAs/AlGaAs, InP/InGaAsP, etc. These materials are grown directly on a Si substrate using epitaxial growth processes, e.g., molecular beam epitaxy (MBE) or metal organic chemical vapor deposition (MOCVD). In one particularly useful embodiment, the III-V layer is formed using a blanket growth process over the entire Si substrate (or a large portion thereof). Blanket growth processes assist in minimizing defects (dislocations) in the grown layer. Lower defect densities permit larger lasers to be fabricated.

In addition, appropriate buffer layers may be employed, as needed, between Si and III-V materials to reduce defect density. The less the defect density, the larger the laser can be made defect free (or the number of defect free lasers in a set of lasers). Monolithic light source devices can be formed on Si with direct growth of III-V material in accordance with the present principles.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., GaInP, InGaAs, GaAs, etc. These compounds include different proportions of the elements within the compound, e.g., InGaAs includes $In_xGa_yAs_{1-x-y}$, where x, y are less than or equal to 1, or GaAs includes $Ga_xAs_{1-x}$ where x is less than or equal to 1, etc. In addition, other elements may be included in the compound, and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a perspective view of a nanolaser 10 is illustratively shown in accordance with one embodiment. The nanolaser 10 is formed on a silicon substrate 12. The substrate 12 includes a silicon based substrate. In a particularly useful embodiment, the substrate 12 includes a monocrystalline silicon substrate. The substrate 12 may include a bulk substrate or a silicon-on-insulator (SOI) substrate. The substrate 12 is preferably a silicon wafer or SOI wafer employed in conventional semiconductor processing. Some advantages for employing silicon substrates 12 include the larger size (more chips per wafer), reduced cost over substrates made with other materials (e.g., III-V materials), and silicon substrates are compatible with common processing techniques and platforms.

A III-V buffer layer 14 is grown by a blanket processing technique. The III-V buffer layer 14 may include a monocrystalline structure. The III-V buffer layer 14 may be grown using molecular beam epitaxy (MBE) or metal organic chemical vapor deposition (MOCVD), although other processes may be employed to grow monocrystalline III-V materials. The III-V buffer layer 14 being grown on silicon of substrate 12 may introduce dislocation defects due to lattice mismatch between these materials. To minimize defects, a blanket growth process is employed. The materials for the buffer layer 14 may include GaAs, AlGaAs, InP, InGaAs, GaN, GaP, or other III-V materials, alloys or combinations thereof. The III-V buffer layer 14 is then patterned using, e.g., lithography to shape the buffer layer 14 in accordance with a particular device design.

The III-V buffer layer 14 may include doped regions to provide conductive paths between a contact 24 (e.g., an n-type contact connecting to an n-doped region in the III-V buffer layer 14).

Once the buffer layer 14 is formed (and patterned if needed) additional layers may be formed on the buffer layer 14 to fabricate the nanolaser 10. In one embodiment, a III-V material is grown on the buffer layer 14 and patterned to form a line 16 having a width, W. The line 16 preferably includes a material that is substantially lattice matched with the buffer layer 14, although dislocation defects in the buffer layer 14 will also present as defects in the line 16. In one embodiment, the buffer layer 14 includes AlGaAs and the material of line 16 includes GaAs. In another embodiment, the buffer layer 14 includes InGaAsP and the material of line 16 includes InP. Other combinations of III-V materials may also be employed.

It should be understood that the line 16 may be include multiple lasers spaced apart from one another. In addition, instead of a line, individual laser stacks may be employed. The line 16 may provide for an edge-emitting or top-emitting laser, as the case may be.

The line 16 is etched to form a notch therein down to the buffer layer 14. A multiple quantum well (MQW) structure 18 is formed in the notch. The MQW 18 is formed by growing alternating layers of thickness (e.g., a few nm) sufficient to form a quantum well to permit lasing of light to be emitted from the nanolaser 10. In one embodiment, the MQW 18 includes alternating layers of InGaAs and AlGaAs. Other III-V materials may also be employed.

A highly doped contact layer 20 is formed on the MQW structure 18 to provide a contact connection to a contact 22. Contact layer 20 may be epitaxially grown on the MQW structure 18. The contact layer 20 may include the same material as the MQW structure 18 and be doped, e.g., p-doped, in accordance with the type of device 10 being employed. Contacts 22 and 24 are formed by a deposition process, e.g., sputtering, evaporation, chemical vapor deposition (CVD), etc. The contacts 22, 24 are then patterned. The contacts 22, 24 may include Pt, Au, Ag, Ti, etc.

The contact 22, the contact layer 20 and the MQW structure 18 include a width W and may include a W by W area. Laser sizes in many instances are defined by a single dimension W, which is a length of a side of a square area of the laser. While this convention will be employed hereinafter for ease of description, the laser dimensions may include different side dimensions (e.g., $W_1 \neq W_2$).

In accordance with the present principles, a nanolaser with W=250 nm is smaller than an average distance between defects when III-V materials are grown on a Si substrate. For example, a nanolaser with W=250 nm has an area of 1/16 of a 1 $\mu m^2$. If a defect density for a particular material (III-V) is $1 \times 10^8$ cm$^{-2}$ (that is, one defect per square micron or 1 $\mu m^{-2}$), then 94% of lasers of this size would be defect free. If the defect density is lower, e.g., $1 \times 10^6$ cm$^{-2}$, 99.9% of lasers of this size would be defect free. These or other percentages may be employed as sizing criteria for laser area.

If the number of defect-free lasers needs to be higher, then the defect density can be reduced by employing different buffer layers, providing reduced lattice mismatch, etc. Also, the less the defect density, the larger the laser can be made defect free.

In accordance with one embodiment, a plurality of buffer layers 14 may be formed from different materials to assist in reducing the defect density. The size of the nanolaser can also be adjusted to increase the percentage of defect free lasers.

Figure 2:
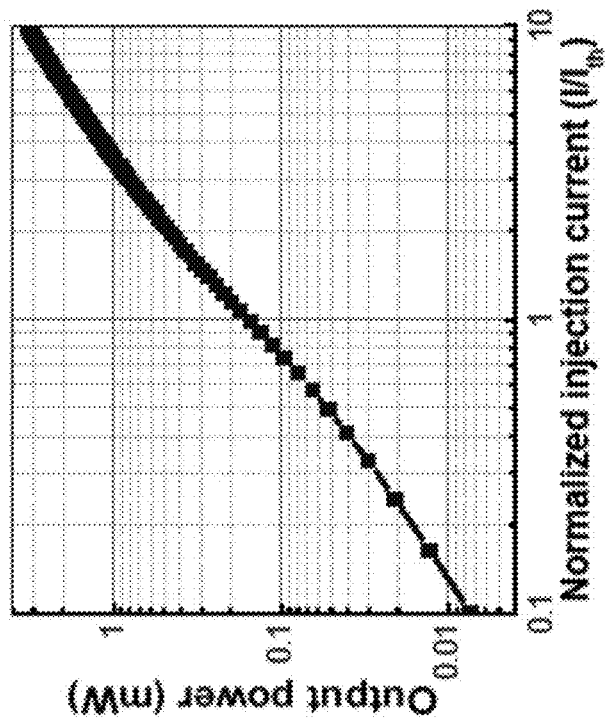
FIG. 2 is a graph plotting simulation results of output power (mW) versus normalized injection current ($I/I_{th}$) for a nanolaser in accordance with the present principles.

Referring to FIG. 2, a plot simulation of output power (mW) versus normalized injection current ($I/I_{th}$) is shown for a nanolaser in accordance with the present principles. The simulated plot shows significant output power for a monolithically grown III-V laser on Si. The laser includes W=250 nm as described. In one embodiment, at an injection current ($I_{th}$) of about 3 mA, about 300 microWatts was output by the laser.

Figure 3:
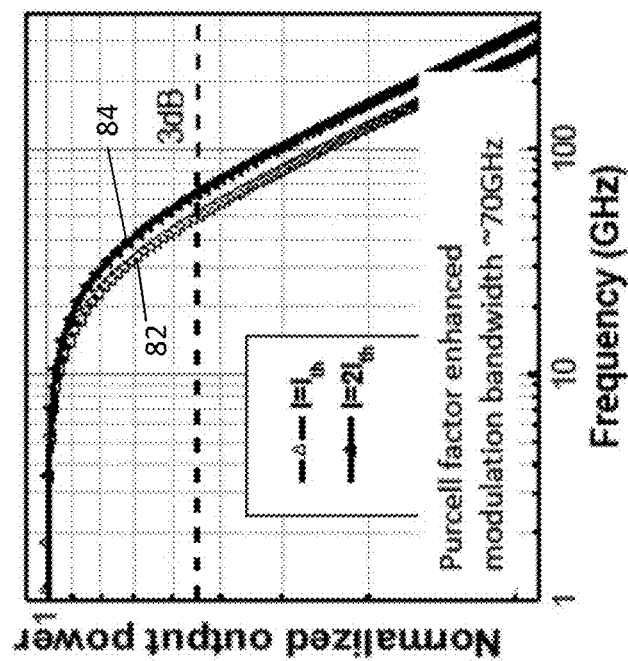
FIG. 3 is a graph plotting simulation results for normalized output power versus frequency (GHz) for a nanolaser showing Purcell factor enhancement in accordance with the present principles.

Referring to FIG. 3, a plot simulation of normalized output power versus frequency (GHz) is shown for a nanolaser in accordance with the present principles. The monolithically grown III-V laser in accordance with the present principles provided an enhanced Purcell factor. The rate of spontaneous emission depends partly on the environment of a light source. This means that by placing the light source in a special environment, the rate of spontaneous emission can be modified, e.g., when they are matched in a resonant cavity. The enhancement is given by the Purcell factor ($F_P$).

In FIG. 3, graph 82 plots current equal to injection current ($I_{th}$), and graph 84 plots current equal to twice the injection current ($2I_{th}$). The modulation bandwidth as shown increases with the injection current. With doubled injection current, modulation bandwidth is enhanced from about 50 GHz to about 70 GHz. The modulation speed of the nanolaser is higher than the conventional lasers due to enhanced light-matter-interaction.

In accordance with the present principles, a defect free monolithic integration may be achieved where III-V lasers are formed on Si substrates. A laser size may be selected based upon the defect density between the materials. In one embodiment, the size of the laser selected is less than a defect density area. In another embodiment, the size of the laser is a fraction of the defect density area to provide a safety factor to ensure that the laser is defect free. The fraction may include between about 0.005 and about 0.50, although other fractions or factors of safety may be employed.

By employing, a silicon substrate, the laser device is compatible with and may be integrated with complementary metal oxide semiconductor (CMOS) technology. CMOS devices may include and be employed to control or measure an integrated laser device (nanolaser). These devices may be formed on the Si substrate 12. The CMOS devices or other devices may also be formed on the buffer layer 14 or other layers (e.g., layer 16). Employing defect free III-V laser materials ensures high performance and lower energy consumption (high energy efficiency). For example, defect losses are minimized, and higher direct modulation speeds can be achieved due to, e.g., Purcell factor enhancement.

Figure 4:
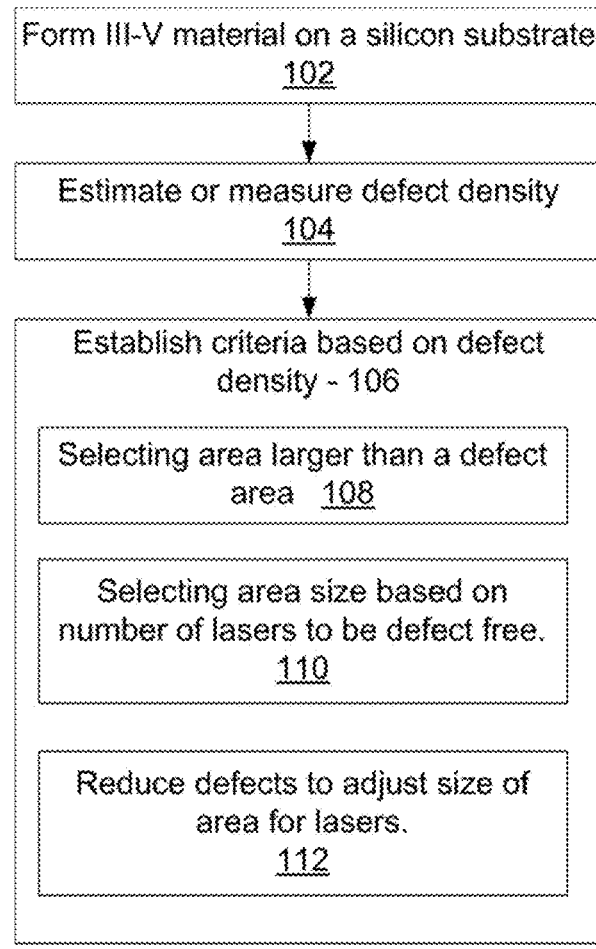
FIG. 4 is a block/flow diagram showing a method for fabricating a nanolaser with III-V materials on monocrystalline silicon in accordance with illustrative embodiments.

Referring to FIG. 4, a method for fabricating a nanolaser is illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a III-V material is formed directly on a silicon substrate. The III-V material may include buffer layers, contact layers, barrier layers, active layers, etc. In useful embodiments, a buffer layer may be formed on the silicon substrate and may include GaAs, e.g., AlGaAs or InGaAsP. One or more III-V layers may be formed on the buffer layer and may include, e.g., GaAs or InP, respectively. Other III-V materials and different layer structures may be employed. The silicon substrate may include a silicon-on-insulator substrate. The silicon substrate may be employed for the formation of other circuitry including but not limited to CMOS devices, etc.

In block 104, a defect density may be estimated or measured due to differences in materials between the III-V material and the silicon substrate. In many instances, the defect density may be known from the lattice mismatch or other characteristics of the materials. In other instances, the defect density may be measured or estimated.

In block 106, based upon the defect density, criteria may be established for sizing a laser region to be formed on or in the III-V material. The size of the laser region may be based upon the defect density or the size may be based upon a percentage of defect free lasers, e.g., 94%, 99.9%, etc. The sizing criteria may be established based on, e.g., sizing the laser by selecting an area less than a defect density area for the laser region in block 108. In block 110, sizing the laser region may include selecting a size to provide at least a certain percentage of lasers (e.g., 99.9% of lasers) being defect free.

In block 112, defect density may be reduced to permit larger laser regions. This may include material selection of III-V material (e.g., to reduce lattice mismatch), selecting deposition processes that yield fewer defects, e.g., blanket depositing the III-V layer on the silicon substrate, etc.

Having described preferred embodiments monolithic III-V nanolaser on silicon with blanket growth (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A nanolaser, comprising:
   a silicon substrate;
   at least one III-V layer formed on the silicon substrate having a defect density due to differences between the III-V and silicon materials; and
   a laser device formed on or in the at least one III-V layer, the laser device having a side length that is smaller than an average distance between defects as determined based upon a numerical value representing the defect density.

2. The nanolaser as recited in claim 1, wherein the at least one III-V layer includes one or more buffer layers.

3. The nanolaser as recited in claim 1, wherein the at least one III-V layer includes a line formed on a buffer layer and a multiple quantum well structure is formed in the line.

4. The nanolaser as recited in claim 1, wherein the laser device is disposed within an area less than a defect density area to provide a defect-free laser.

5. The nanolaser as recited in claim 1, wherein the side length of the laser device is selected to provide at least 94% of lasers that are defect free.

6. The nanolaser as recited in claim 1, wherein the side length of the laser device is selected to provide at least 99.9% of lasers that are defect free.

7. The nanolaser as recited in claim 1, wherein the side length results in an area of less than about $1/16$ of a squared micron.

8. The nanolaser as recited in claim 1, wherein the at least one III-V layer includes a blanket deposited layer on the silicon substrate.

9. A nanolaser, comprising:
   a silicon substrate;
   a buffer layer including GaAs formed on the silicon substrate and having a defect density due to differences between the III-V and silicon materials; and
   one or more III-V layers formed on the buffer layer and configured to support a laser device formed on or in the one or more III-V layers, the laser device includes a multiple quantum well structure and has a side length that is smaller than an average distance between defects as determined based upon a numerical value representing the defect density.

10. The nanolaser as recited in claim 9, wherein the one or more III-V layers includes additional buffer layers.

11. The nanolaser as recited in claim 9, wherein the buffer layer includes one of AlGaAs or InGaAsP and the one or more III-V layers includes GaAs or InP, respectively.

12. The nanolaser as recited in claim 9, wherein the laser device is disposed within an area less than a defect density area to provide a defect-free laser.

13. The nanolaser as recited in claim 9, wherein the side length of the laser device is selected to provide at least 94% of lasers that are defect free.

14. The nanolaser as recited in claim 9, wherein the side length of the laser device is selected to provide at least 99.9% of lasers that are defect free.

15. The nanolaser as recited in claim 9, wherein the side length results in an area that is less than about $1/16$ of a squared micron.

16. The nanolaser as recited in claim 9, wherein the buffer layer includes a blanket deposited layer on the silicon substrate.

17. A method for fabricating a nanolaser, comprising:
    forming a III-V material directly on a silicon substrate;
    estimating a defect density due to differences in materials between the III-V material and the silicon substrate; and
    sizing a laser device to be formed on or in the material wherein a side length of the laser device is smaller than an average distance between defects as determined based upon a numerical value representing the defect density.

18. The method as recited in claim 17, wherein sizing the laser device includes selecting an area less than a defect density area for the laser device to provide a defect-free laser.

19. The method as recited in claim 17, wherein sizing the laser device includes selecting a size to provide at least 99.9% of lasers that are defect free.

20. The method as recited in claim 17, further comprising reducing defect density to permit larger laser device.

* * * * *